United States Patent [19]
Miki et al.

[11] Patent Number: 5,010,338
[45] Date of Patent: Apr. 23, 1991

[54] COMPARATOR CIRCUIT AND ANALOG TO DIGITAL CONVERTER

[75] Inventors: Takahiro Miki; Shiro Hosotani, both of Hyogo, Japan

[73] Assignee: Mitsubishi Denki Kabushiki Kaisha, Tokyo, Japan

[21] Appl. No.: 260,126

[22] Filed: Oct. 18, 1988

[30] Foreign Application Priority Data

Oct. 19, 1987 [JP] Japan .................. 62-264159

[51] Int. Cl.$^5$ ................ H03K 5/24; H03M 1/36
[52] U.S. Cl. ....................... 341/159; 307/355; 307/362
[58] Field of Search ............ 341/159, 158, 155; 340/146.2; 307/362, 355; 330/9

[56] References Cited

U.S. PATENT DOCUMENTS

| | | | |
|---|---|---|---|
| 4,507,649 | 3/1985 | Dingwall et al. | 341/159 |
| 4,532,438 | 7/1985 | Reiner | 341/159 X |
| 4,539,551 | 9/1985 | Fujita et al. | 341/158 X |
| 4,612,531 | 9/1986 | Dingwall et al. | 341/159 X |
| 4,691,189 | 9/1987 | Dingwall et al. | 341/158 X |
| 4,695,748 | 9/1987 | Kumamoto | 307/362 X |

OTHER PUBLICATIONS

IEEE Journal of Solid State Circuits, vol. SC-21, No. 6, Dec. 1986: "An 8-Bit High-Speed CMOS A/D Converter".
"CMOS 8b 25MHz Flash ADC", Digest of Technical Papers, IEEE International Solid-State Circuits Conf., 1985.

Primary Examiner—A. D. Pellinen
Assistant Examiner—Sharon D. Logan
Attorney, Agent, or Firm—Lowe, Price, Leblanc, Becker & Shur

[57] ABSTRACT

A comparator circuit capable of high-speed and accurate operation is disclosed. The comparator circuit includes an amplifier section 4, an inverter 5 connected to the output of the amplifier section 4, and a switching circuit 11 connected across the inverter 5. The amplifier section 4 contains a capacitor 1, an inverter 2 and a switching circuit 3 connected across the inverter 2. Coupled to the input of the amplifier section 4 are switching circuits 8 and 9 for supplying voltages $V_1$ and $V_2$ to be compared under timing control. During the first half cycle of comparing operation, the switching circuits 8, 3 and 11 are turned on while the switch circuit 9 is turned off. During the second half cycle of comparing operation, the switching circuit 9 is turned on while the switching circuits 8, 3 and 11 are turned off. The inverter 5, being short circuited by the switching circuit 11, produces a predetermined intermediate voltage during the first half of operating cycle, which is effective to generate voltage outputs accurately and exactly representing the compared results during the second half of the operating cycle.

13 Claims, 5 Drawing Sheets

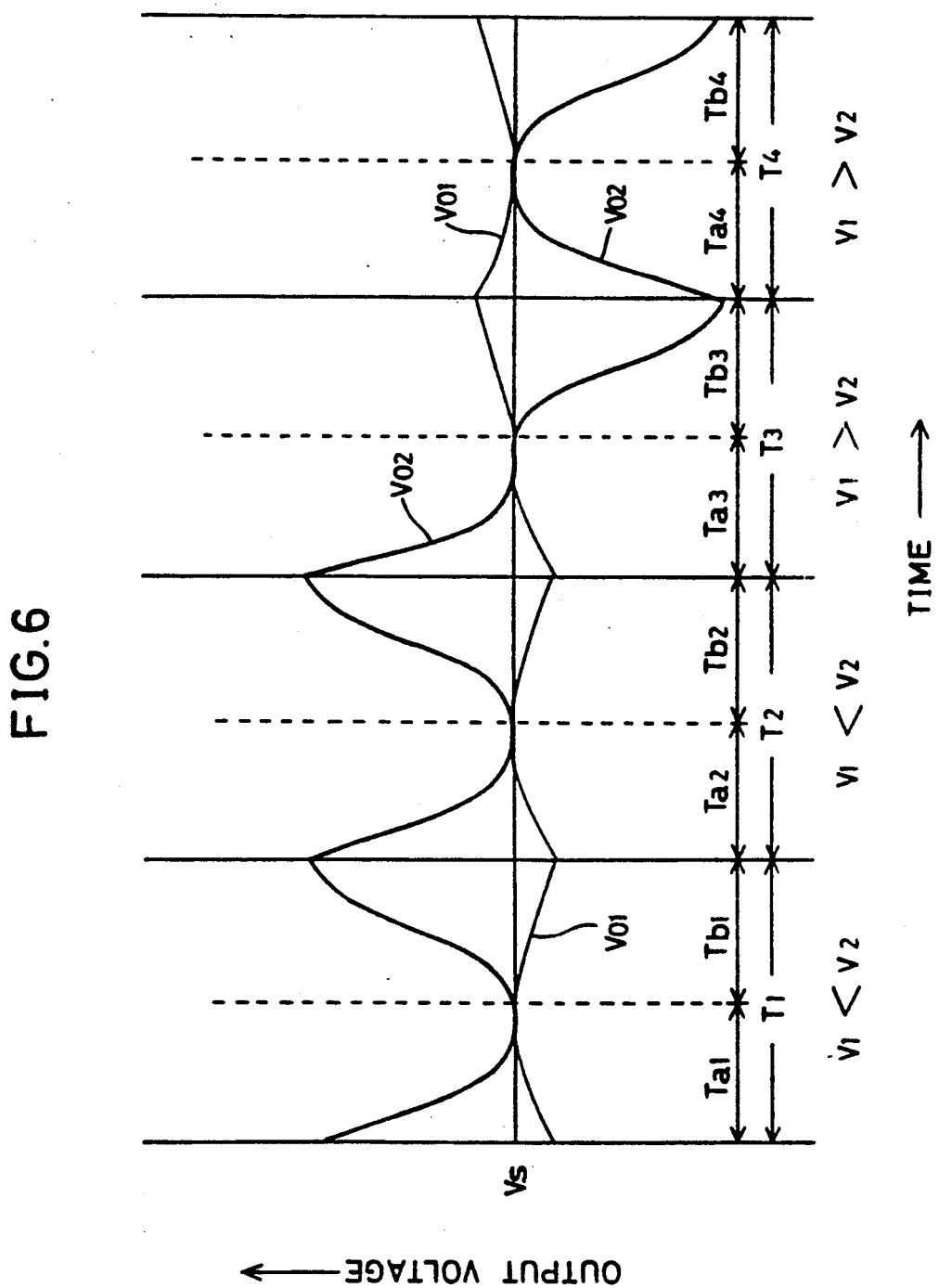

COMPARATOR CIRCUIT AND ANALOG TO DIGITAL CONVERTER

BACKGROUND OF THE INVENTION

1. Field of the Invention

This invention relates generally to a comparator circuit, and in particular to a comparator circuit which is capable of performing high-speed as well as reliable operation and has particular applicability to an analog to digital converter.

2. Description of the Prior Art

There is illustrated in FIG. 1 a typical prior-art analog to digital converter (A/D converter). The A/D converter includes a reference voltage supply 504, a plurality of comparator 501 to 50n, and a decoder 505 which is connected in common to the outputs of the comparator 501 to 50n. In operation, the voltage generated by the reference voltage supply 504 is divided by series connected resistor 601 to 60(n+1), and divided voltages are supplied to one inputs of the comparators 501 to 50n. Voltage signals $V_2$ to be converted into digital signals are applied to the other inputs of the comparators 501 to 50n. Each of the comparators 501-50n compares the input voltage levels at one and the other inputs, and supplies a voltage signal representative of the compared results to the decoder 505, which in turn produces a digital signal proportional to the compared results.

FIG. 2 shows a circuit configuration of a prior-art comparator circuit. The type of the comparator circuit shown in FIG. 2 is disclosed, for example, in Digests of Technical Papers pp. 34-35 presented in International Solid-State Circuits Conference of February 1985.

Referring to FIG. 2, the comparator circuit includes an input terminal 6 to receive a first input voltage $V_1$, and an input terminal 7 to receive a second input voltage $V_2$, an amplifier section 4 having a capacitor 1, and an inverters 5 connected to the output of the amplifier section 4. A switching circuit 8 is inserted between the input terminal 6 and the amplifier section 4, and another switching circuit 9 is provided between the input terminal 7 and the amplifier section 4. The amplifier section 4 includes a capacitor 1, one electrode of which is connected to a node Na to receive signals from the switching circuit 8 or 9. The capacitor 1 has the other electrode connected to a node Nb. The amplifier section 4 also includes an inverter 2 coupled to the node Nb and a switching circuit 3 connected across the inverter 2. The inverter 5 provides at its output terminal 10 voltage signals of two different values representative of compared results.

Now the operation of the comparator circuit is described, assuming that: the inverters 2 and 5 have identical transfer characteristics; the switching circuits 8 and 9 are controlled to turn on in an alternate fashion; and the switching circuit 3 is controlled to turn on in synchronization with the turning-on of the switch circuit 8.

During the first half of an operating cycle, the switch circuits 8 and 3 are turned on, while the switch circuit 9 is turned off. As a result, an input voltage $V_1$ is supplied to the node Na. A turning-on of the switch circuit 3 across the inverter 2 applies a shunted voltage Vs to the node Nb. The shunted voltage Vs is next referred to.

Graphs in FIG. 3 illustrate input-output characteristic (or transfer characteristics) of the inverter 2. The abscissa gives the input voltage of the inverter 2 and the ordinate is the output voltage of the same inverter. The curve a shows the input-output characteristics of the inverter 2, while the straight line b indicates the input-output characteristics of the inverter when its input voltage Vi is equal to its output voltage $V_0$. The shunted voltage Vs is equal to the voltage represented by the point c where the curve a and the line b cross.

Thus, during the first half of the operating cycle, the node Nb is charged up to the potential of $Vs-V_1$ with respect to the node Na.

During the second half of the operating cycle, the switching circuits 8 and 3 are turned off, while the switching circuit is turned off, and a voltage $V_2$ is applied to the node Na. Due to the off state of the switching circuit 3, the node Nb is kept at a high impedance. Thus, if the effect of parasitic capacitance can be ignored, the potential difference $Vs-V_1$ produced between the nodes Na and Nb is maintained at the beginning of the second half of the operating cycle. Under the circumstances, as the voltage applied to the node Na changes from $V_1$ to $V_2$, the voltage at the node Nb varies by $V_2-V_1$. Consequently, the node Nb is brought to a potential of $Vs-V_1+V_2$.

As can be seen in FIG. 3, the output of the inverter 2 is biased to voltage Vs at point c where higher amplification is obtained. This ensures that, even if the shift in the input voltage $V_2-V_1$ of the inverter 2 is very small during the second half of the operating cycle, its output voltage exhibits a relatively large amount of change. When the amplification of the inverter is defined $-A$, its output voltage $V_{01}$ is given as follows:

$$V_{01} = Vs - A(V_2 - V_1) \tag{1}$$

On the other hand, since the inverter 5 possesses the input-output characteristic identical to the inverter 2, the inverter 5 produces a voltage Vs in the first half of the operating cycle. Accordingly, during the second half of the operating cycle, the shift in the output voltage $-A(V_2-V_1)$ of the inverter 2 is further amplified by the inverter 5. Assuming that the inverter 5 has the same amplification $-A$ as the inverter 2, the output voltage $V_{02}$ of the inverter 5 is given as:

$$V_{02} = Vs + A^2(V_2 - V_1) \tag{2}$$

As has been explained hereinabove, the comparator circuit generates the voltage Vs during the first half of the operating cycle, and produces a voltage signal in proportion to a potential difference between the input voltages $V_1$ and $V_2$ during the second half of the operating cycle. In other words, the comparator provides a logic signal "H" or "L" representative of the result obtained by comparing the input voltage $V_1$ with the input voltage $V_2$.

As stated previously, the inverter 2 produces the voltage Vs with a predetermined delay, followed by the generation of the voltage Vs by the inverter 5 with a transfer delay between its input and output terminals. These delays do little harm when the comparator circuit operate at lower speeds, but give rise to some problems when the comparator operates at higher speeds. In a high-speed operation of the comparator, even if the inverter 2 produces a voltage Vs during the first half of the operating cycle, the comparator operation proceeds into the second half of the operating cycle with the inverter 5 not generating the potential Vs. This may result in an erroneous operation, which will be explained in detail.

FIG. 4 is a timing chart showing changing output voltages of the inverters 2 and 5 as the comparator circuit operates at high-speeds. In FIG. 4, four operating cycles T1 to T4 of the comparator circuit are shown. During the operating cycles T1 and T2, the input voltage $V_1$ is lower than the input voltage $V_2$, while in operating cycles T3 and T4, the input voltage $V_1$ is higher than the input voltage $V_2$. Time intervals Ta1 to Ta4 correspond to the first half of respective operating cycles, and time intervals Tb1 to Tb4 to the latter half of respective operating cycles.

In the operating cycles T1 and T2 where the input voltage $V_1$ is lower than the input voltage $V_2$, the output voltage $V_{01}$ of the inverter 2 rises close to the voltage level Vs during the time intervals Ta1 and Ta2, and it falls gradually off the voltage level Vs during the time intervals Tb1 and Tb2. Theoretically, the output voltage $V_{01}$ reaches $Vs - A(V_2 - V_1)$.

On the other hand, the output voltage $V_{02}$ of the inverter 5 does not fall down to the level of the voltage Vs not only through the time intervals Ta1 and Ta2, but through the time intervals Tb1 and Tb2. With the input voltage $V_1$ lower than the input voltage $V_2$ during the operating cycles T1 and T2, the output voltage $V_{02}$ of the inverter 5 higher than the voltage Vs does not prevent the generation of accurate comparison results.

However, during two successive cycles of operation where the relative relations between the input voltages $V_1$ and $V_2$ reverse themselves as demonstrated in the operating cycles $T_2$ and $T_3$, the above stated voltage conditions lead to erroneous operations to be described next. The output voltage $V_{02}$ is higher than the voltage Vs at the end of the time interval Tb2. During the operating cycle T3, the output voltage $V_{02}$ of the inverter 5 fails to reach the level of the voltage Vs because of the input voltage $V_1$ higher than the voltage level $V_2$. In the beginning of the time interval Tb3, the input voltage $V_{02}$ starts to fall off, but it fails to drop enough to be lower than the voltage Vs even at the end of the time interval Tb3 due to the fact that the output voltage $V_{02}$ of the inverter 5 is substantially higher than the voltage Vs at the start of the time interval Tb3. Phrased differently, during the operating cycle T3, the inverter 5 generates an output voltage $V_{02}$ higher than the voltage Vs despite the input voltage $V_1$ being higher than the input voltage $V_2$. Thus, the comparator fails to provide accurate comparison results in the operating cycle T3.

SUMMARY OF THE INVENTION

It is an object of this invention to provide a comparator circuit capable of producing accurate comparison results at high-speed operation.

It is an another object of the invention to provide a comparator circuit capable of generating voltage outputs accurately representing comparison results at the end of each comparison cycle of operation at higher speeds.

It is still another object of the invention to provide a comparator circuit capable of producing a predetermined output voltage in the middle of each comparison cycle of high-speed operation.

It is still another object of the invention to provide a novel A/D converter capable of performing high-speed and reliable analog to digital conversion of voltage signals.

A comparator circuit for comparing a first and second input voltages comprising: first input for receiving the first input voltage; second input for receiving the second input voltage; capacitor means having first and second electrodes; first switching circuit connected between the first input and the first electrode of capacitor; second switching circuit connected between the second input and the first electrode of the capacitor; a first inverter having a input connected to the second electrode of the capacitor; third switching circuit connected across the first inverter; a second inverter having an input conductively connected to the output of the first inverter; fourth switching circuit connected across the second inverter; timing control circuit connected to the first, second, third and fourth switching circuit for controlling the switching operations thereof such that the first, third and fourth switching circuit are turned on whereas the second switching circuit is turned off during the first half of operating cycle, and the first, third and fourth switching circuit are turned off whereas the second switching circuit is turned on during the second half of the operating cycle.

In operation, the first, the third and the fourth switching circuits are turned on during the first half of the operating cycle to apply a first input voltage to one electrode of the capacitor. At the end of the first half of the operating cycle, the inputs and outputs of the first and second inverters are connected to provide a predetermined intermediate voltage, respectively. During the second half of the operating cycle, only the second switching circuit is turned on to apply a second input voltage to one electrode of the capacitor. A signal representing the results obtained by comparing the levels of the first and second input voltages is supplied to the second inverter through the capacitor and first inverter. The second inverter, having being brought to a predetermined an intermediate voltage, generates a voltage output higher or lower than the intermediate voltage in response to the signal representative of the compared results. Consequently, the voltage signal accurately and exactly indicative of the compared result is produced by the second inverter.

In a preferred embodiment of the invention, the fourth switch circuit comprises a transmission gate. By providing the transmission gate across the fourth inverter, a comparator circuit capable of producing accurate compared results may be readily obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a timing diagram for the comparator circuit of FIG. 5 which is helpful in understanding the operation thereof at high speeds;

DESCRIPTION OF THE PREFERRED EMBODIMENT

Figure 2:
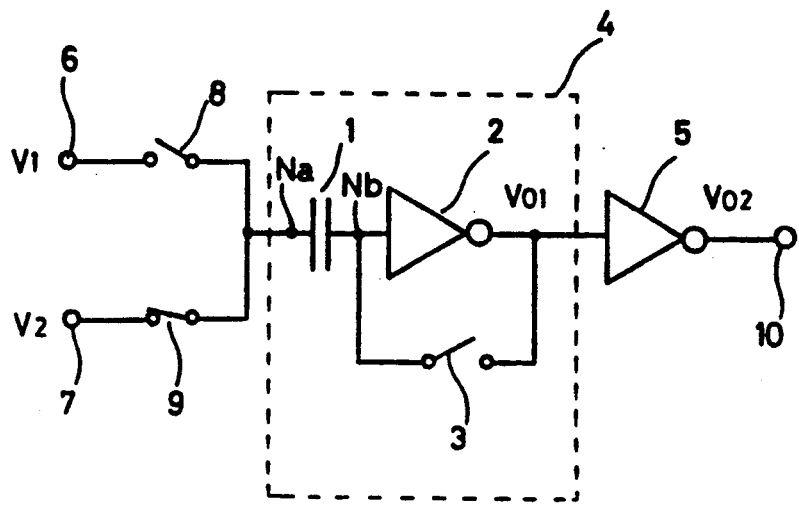
FIG. 2 is a circuit diagram of a prior art comparator circuit.
Figure 3:
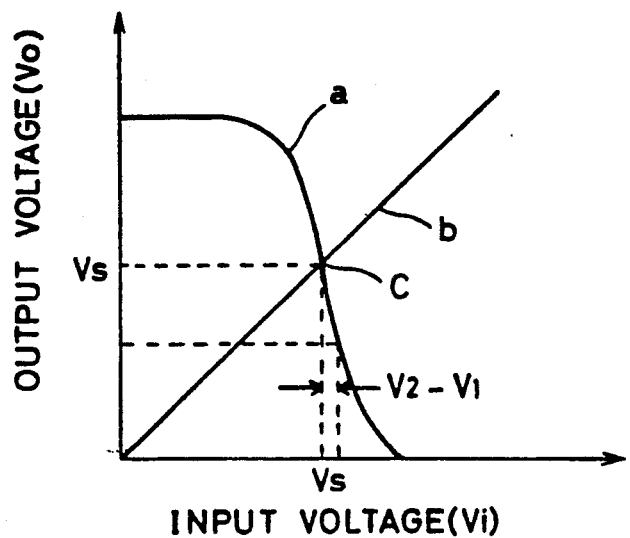
FIG. 3 is a graphic representation showing input-output characteristics (transfer characteristics) of the inverter shown in FIG. 2.
Figure 5:
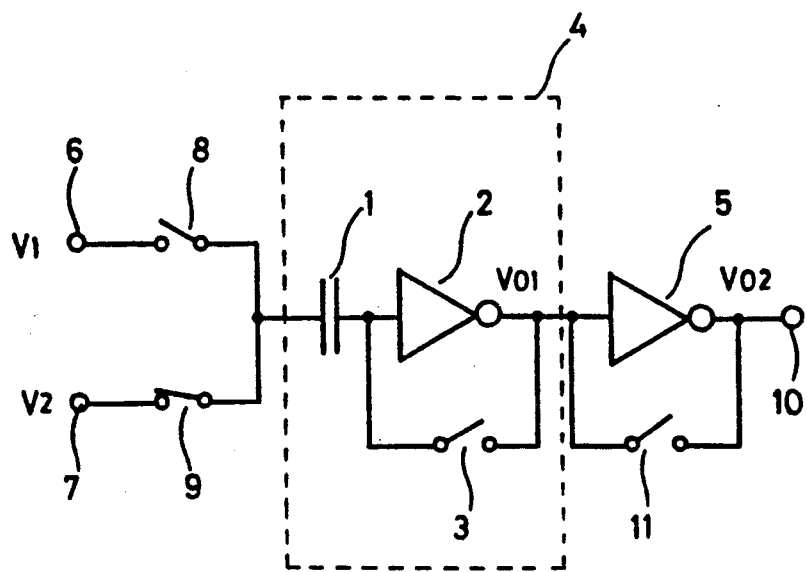
FIG. 5 is a circuit diagram of a comparator circuit according to one embodiment of the invention.

In FIG. 5, there is illustrated a comparator circuit according to a preferred embodiment of the invention. The comparator circuit of FIG. 5 generally identical in construction to that shown in FIG. 2 except that a shunting switching circuit 11 is connected across the inverter 5. The shunting switching circuit 11 is controlled to turn on in synchronization with the switching circuit 3. Circuit components other than the switching circuit 11 and their arrangement are identical to those employed in the comparator circuit of FIG. 2. Accordingly, no further detailed description is given on them.

Figure 4:
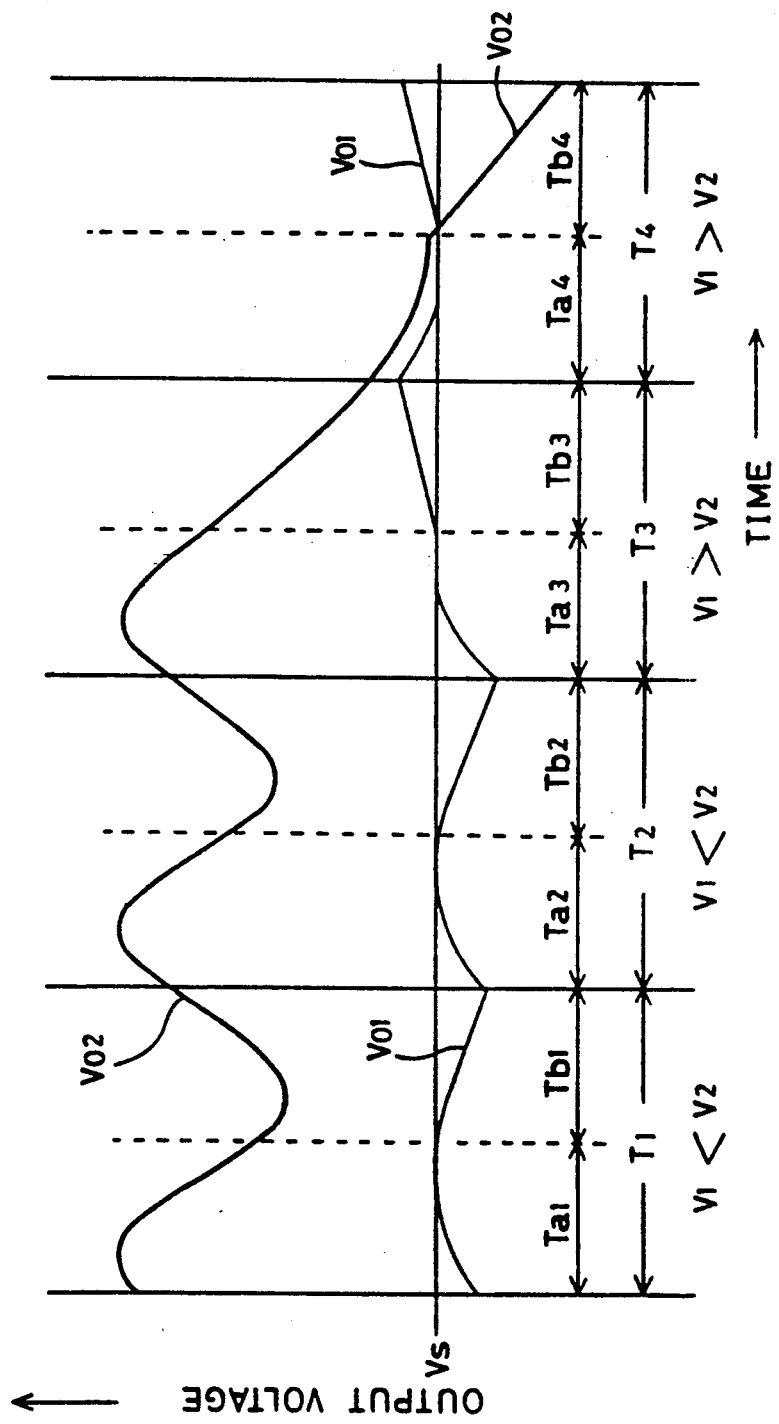
FIG. 4 is a timing diagram for the comparator circuit of FIG. 2 helpful in understanding the high speed operation thereof.

A timing diagram showing in FIG. 6 is for the comparator circuit of FIG. 5 operating at high speeds. Relative voltage levels between the input voltages $V_1$ and $V_2$ during successive comparison cycles of operation are the same as in FIG. 4. The switching circuits 8, 3, 9 and 11 are controlled so that the switching circuit 8, 3 and 11 are turned on and the switching circuit 9 is turned off in the course of time intervals Ta1-Ta4 from the first half of the comparison cycles of T1 to T4. During time intervals Tb1-Tb4 for the second half of the comparison cycles T1 to T4, the switching circuits 8, 3 and 11 are turned off, whereas the switching circuit 9 is turned on.

The operation of the comparator circuit of the invention is described with reference to FIGS. 5 and 6. As will be seen in FIG. 6, the output voltage $V_{01}$ for the inverter 2 reaches to the level of the voltage Vs toward the ends of the time intervals Ta1-Ta4. And, during the operating cycles T1 and T2 where the input voltage $V_1$ is lower than the input voltage $V_2$, the input voltage $V_{01}$ for the inverter 2 drops off the voltage level Vs at the ends of the time intervals Tb1 and Tb2. On the other hand, in the operating cycles T3 and T4 where the input voltage $V_1$ is higher than the input voltage $V_2$, the input voltage $V_{01}$ of the inverter 2 rises above the voltage level Vs at the ends of the time intervals Tb3 and Tb4.

Meanwhile, the output voltage $V_{02}$ for the inverter 5 falls off or rises to the level of the shunt voltage Vs through the time intervals Ta1-Ta4 in the successive operating cycles T1 to T4 because the inverter is short circuited by the switching circuit 11 during these time periods. Thus, the output voltage $V_{01}$ for the inverter 5 begins shifting to the voltage level Vs well before the output voltage $V_{01}$ for the inverter 2 reaches the voltage level Vs so that both output voltages $V_{01}$ and $V_{02}$ get to the level of the voltage Vs almost simultaneously. This ensures that the output voltage $V_{02}$ of the inverter 5 reaches the voltage level Vs at the end of the time interval Ta3 even during two successive operating cycles where the relative voltage levels between the output levels $V_1$ and $V_2$ are reversed. Consequently, at the end of the time interval Tb3, the output voltage $V_{02}$ is right at the level required for producing flawless comparison results.

In the illustrated embodiment, one inverter 5 is shown connected to the output terminal of the amplifier section 4. However, a plurality of cascaded inverters may suitably be coupled to the output terminal of the amplifier section 4 if desired. In such modification, a shunt switching circuit may be connected across any one or every one of the cascaded inverters.

Figure 7A:
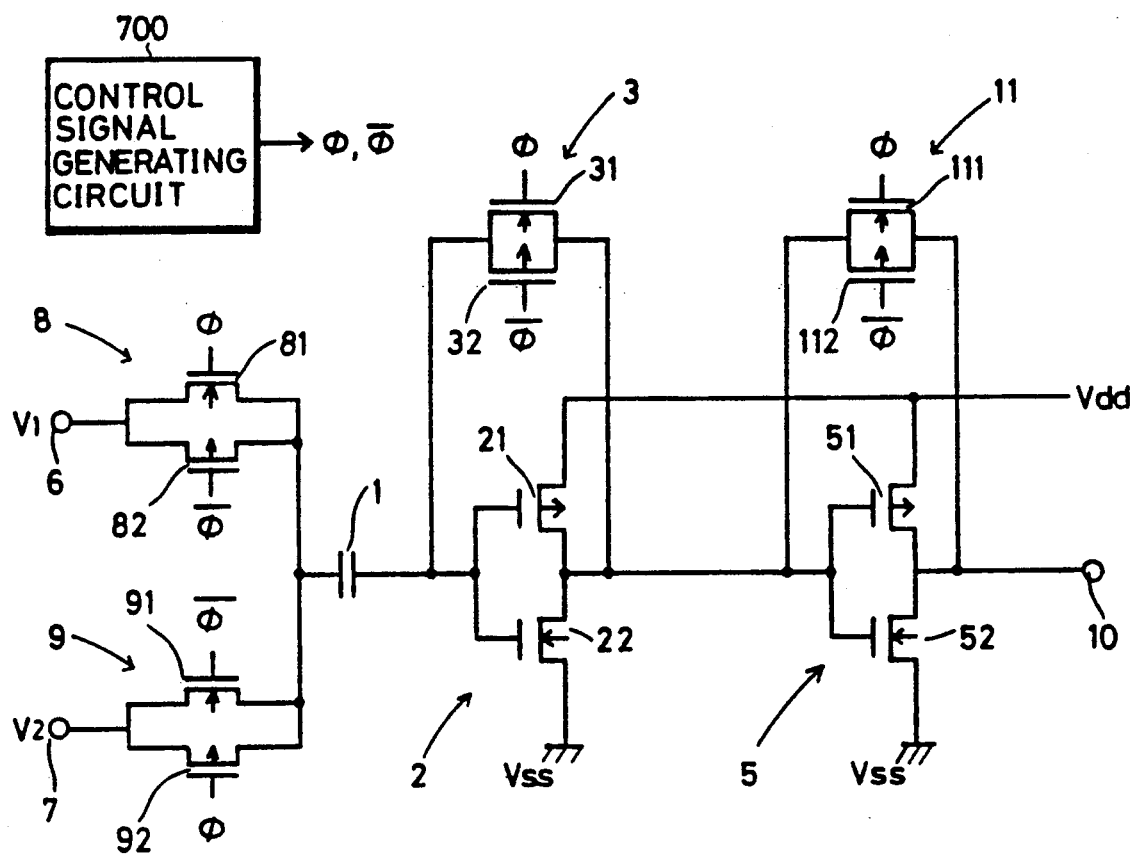
FIG. 7A is a circuit diagram showing a detailed circuit configuration of the comparator circuit shown in FIG. 5.
Figure 7B:
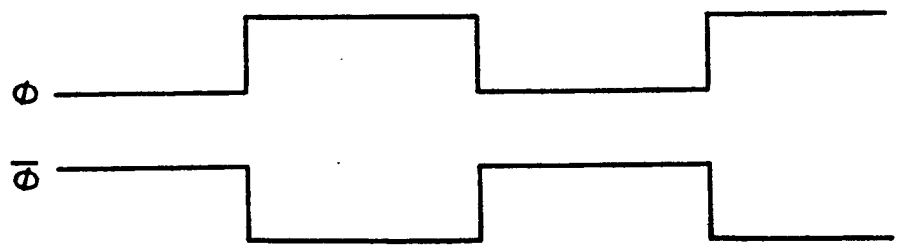
FIG. 7B is a timing diagram for signals to control the operation of the comparator circuit shown in FIG. 7A.

FIG. 7A shows in detail the circuit configuration of the comparator circuit of FIG. 5, and FIG. 7B is a timing diagram of signals $\phi$ and $\overline{\phi}$ for controlling the comparator circuit. Turning to FIG. 7A, the switching circuit 8 comprises a NMOS transistor 81 and a PMOS transistor 82 connected in parallel with each other. The comparator circuit has an associated circuit 700 to generate control signals $\phi$ and $\overline{\phi}$ for timing control. Thus, the transistor 81 has its gate connected to the control signal generating circuit 700 to receive the control signal $\phi$ therefrom, while the transistor 82 has its gate connected to the generator circuit 700 to receive the signal $\overline{\phi}$ therefrom. The switching circuit 9 includes a NMOS transistor 91 and a PMOS transistor 92 which are connected parallel with each other. The transistor 91 has its gate coupled to the signal generating circuit 700 to receive the signal $\overline{\phi}$, while the transistor 92 has its gate connected to the circuit 700 to receive the signal $\phi$. The inverter 2 comprises a PMOS transistor 21 and a NMOS transistor 22 which are series connected between a voltage source Vdd and ground Vss. The other inverter 5 consists of a PMOS transistor 51 and a NMOS transistor 52 connected in series between the voltage source Vdd and ground Vss. The switching circuit (transmission gate) 3 includes a NMOS transistor 31 and a PMOS transistor 32 which are connected in parallel with each other across the inverter 2. The gate of the transistor 31 is coupled to the signal generating circuit 700 to receive the signal $\phi$, while the gate of the transistor 32 is coupled to the circuit 700 to receive the signal $\overline{\phi}$ therefrom. The switching circuit (transmission gate) 11 includes a NMOS transistor 111 and a PMOS transistor 112 which are connected in parallel to each other across the inverter 5. The gate of the transistor 111 is connected to the circuit 700 for generating control signals to receive the signal $\phi$ therefrom, while the gate of the transistor 112 is connected to the circuit 700 to receive the signal $\overline{\phi}$.

Figure 1:
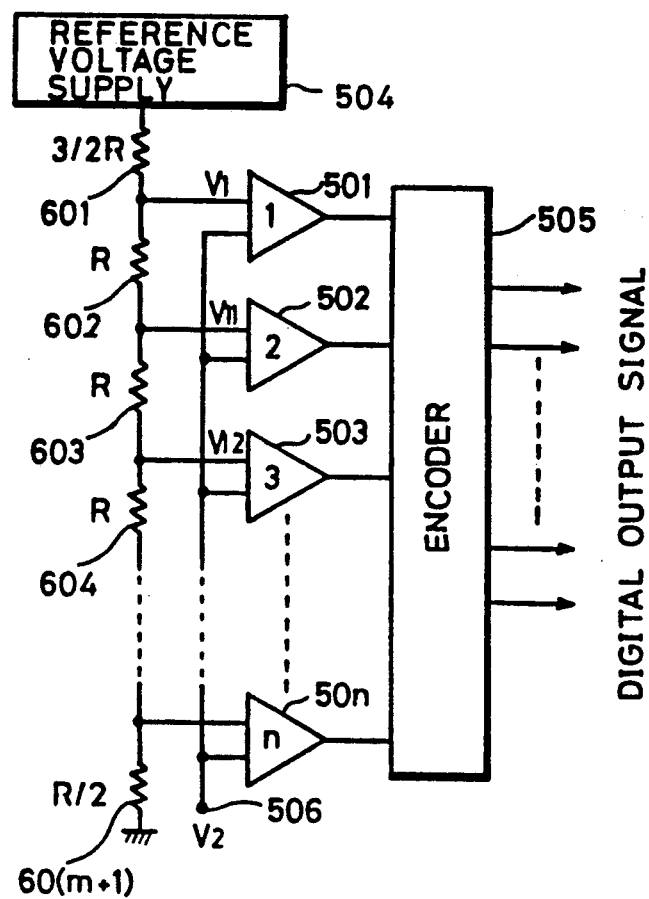
FIG. 1 is a block diagram showing a general arrangement of a prior art A/D converter.

By incorporating the comparator circuit of FIG. 7A into the A/D converter of FIG. 1, an A/D converter capable of high-speed and reliable operation is obtained.

With the output voltage $V_{02}$ of the inverter 5 reaching the voltage level Vs at the end of the first half of each operating cycle or in the middle of each operating cycle as illustrated in FIG. 6, the inverter 5 provides a voltage signal accurately representing the compared results at the end of each comparison cycle of operation.

The use of this inverter makes it possible to provide a comparator circuit which is capable of providing accurate and exact comparison results at higher operating speeds.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A comparator circuit for comparing first and second input voltages comprising:
   first input means for receiving said first input voltage;
   second input means for receiving said second input voltage;
   capacitor means having first and second electrodes;

first switching means connected between said first input means and said first electrode of said capacitor means;

second switching means connected between said second input means and said first electrode of said capacitor means;

first inverter means having an input connected to said second electrode of said capacitor means;

third switching means connected across said first inverter means;

second inverter means having an input conductively connected to the output of said first inverter means;

fourth switching means connected across said second inverter means;

timing control means connected to said first, second, third and fourth switching means for controlling the switching operations thereof such that said first, third and fourth switching means are turned on whereas said second switching means is turned off at a first timing, and said first, third and fourth switching means are turned off whereas said second switching means is turned on at a second timing later than said first timing.

2. A comparator circuit according to claim 1 wherein said fourth switching means comprises first transmission gate means.

3. A comparator circuit according to claim 1 wherein said timing control means signal generating means for generating a first clock signal and a second clock signal inverted with respect to said first clock signal, and said first and second timings are determined by said first and second clock signals.

4. A comparator circuit according to claim 3 wherein said fourth switching means comprises first transmission gate means and said first transmission gate means comprises:

a first field effect device of one conductivity type and having a control electrode;

a second field effect device of opposite conductivity having a control electrode and connected parallel to said first field effect device, said first field effect device has said control electrode connected to receive said first clock signal and said second field effect device has its control electrode connected to receive said second clock signal.

5. A comparator circuit according to claim 1 wherein said inverter means comprises first complementary inverter means and said second inverter means comprises second complementary inverter means.

6. A comparator circuit according to claim 1 wherein said first switching means comprises second transmission gate means, said second switching means comprises third transmission gate means and said third switching means comprises fourth transmission gate means.

7. A comparator circuit according to claim 4 wherein said one conductivity type is p-type and said opposite conductivity type is n-type.

8. An analog to digital converter comprising:

a plurality of comparators, each having a first and second inputs;

means for generating a plurality of reference voltages connected to said plurality of comparators to apply said reference voltages to said first inputs of said comparators;

means connected to said plurality of comparators for applying analog voltage to be converted into digital form to said second inputs of said comparators;

encoding means connected to the outputs of said plurality of comparators for encoding the output signals from said comparators into digital signals, each of said plurality of comparators comprising capacitor means having first and second electrodes, first switching means connected between said first electrode of said capacitor means and said first input, second switching means connected between said first electrode of said capacitor means and said second input, first inverter means having its input connected to said second electrodes of said capacitor means, third switching means connected across said first inverter means, second inverter means having its input conductively connected to the output of said first inverter means, fourth switching means connected across said second inverter means, timing control means for controlling the operations of said first, second, third and fourth switching means such that said first, third and fourth switching means are turned on whereas said second switching means is turned off at a first timing, and said first, third and fourth switching means are tuned off while said second switch means is turned on at a second timing later than said first timing.

9. A circuit for amplifying a differential between first and second input signals comprising:

an amplifying stage having an input and an output;

first switching means connected across said amplifier stage;

first means for selectively applying a first signal to said input of said amplifying stage;

second means for selectively applying a second input signal to said amplifying stage and for comparing said second input signal with said first input signal and for producing a signal at the output of said amplifying stage indicative of the difference between said second input signal and said first input signal;

inverter means having an input conductively connected to the output of said amplifier stage;

second switching means connected across said inverter means;

timing control means connected to said first and second means for selectively applying input signals to said amplifying stage and to said first and second switching means for controlling the operations thereof such that said first and second switching means are turned on when said first signal is applied to said input of said amplifying stage and are turned off when said second input signal is applied to the input of said amplifying stage.

10. A circuit for amplifying a differential between first and second input voltages comprising:

an amplifying stage having a capacitive input and an output and first inverter means connected between said capacitive input and said output;

first switching means for selectively connecting said first input signal to said capacitive input;

second switching means for selectively connecting said second input signal to said capacitive input;

third switching means connected across said first inverter means;

second inverter means having an input conductively connected to the output of said first inverter means;

fourth switching means connected across said second inverter means;

timing control means connected to said first, second, third and fourth switching means for controlling the switching operations thereof such that said first, third and fourth switching means are turned on whereas said second switching means is turned off at a first timing, and said first, third and fourth switching means are turned off whereas said second switching means is turned on at a second timing later than said first timing.

11. A comparator circuit for comparing first and second voltages comprising:

a first input node for receiving said first voltage, first switching means connected between said first input node and a first connecting node, a second input node for receiving said second voltage, second switching means connected between said second input node and said first connecting node, capacitor means connected between said first connecting node and a second connecting node, first inverter means having an input node and an output node, said inverter means having the input node connected to said second connecting node, third switching means connected between the input node and the output node of said first inverter means, second inverter means having an input node and an output node, said second inverter means having the input node directly connected to the output node of said first inverter means, and fourth switching means connected between the input node and the output node of said second inverter means, said fourth switching means being in a conductive state when said third switching means is in a conductive state, said fourth switching means being in a non-conductive state when said third switching means is in a non-conductive state.

12. A comparator circuit according to claim 11, wherein said first voltage includes a reference voltage, and said second voltage includes a signal voltage to be compared with said reference voltage.

13. A comparator circuit according to claim 11, said third switching means shunting voltages at the input node and the output node of said first inverter means, said fourth switching means shunting voltages at the input node and the output node of said second inverter means.

* * * * *